US006881988B2

(12) United States Patent
Niwa et al.

(10) Patent No.: US 6,881,988 B2
(45) Date of Patent: Apr. 19, 2005

(54) HETEROJUNCTION BIPOLAR TRANSISTOR AND SEMICONDUCTOR INTEGRATED CIRCUIT DEVICE USING THE SAME

(75) Inventors: Takaki Niwa, Kawasaki (JP); Hidenori Shimawaki, Kawasaki (JP); Koji Azuma, Kawasaki (JP); Naoto Kurosawa, Kawasaki (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/218,775

(22) Filed: Aug. 14, 2002

(65) Prior Publication Data

US 2003/0136956 A1 Jul. 24, 2003

(30) Foreign Application Priority Data

Jan. 18, 2002 (JP) ........................................ 2002-010456

(51) Int. Cl.$^7$ ................. H01L 31/0328; H01L 31/0336; H01L 31/072; H01L 29/06; H01L 31/109
(52) U.S. Cl. ......................... 257/197; 257/15; 257/198; 257/593
(58) Field of Search ................................ 257/197, 198, 257/14–15, 12, 17, 22, 593

(56) References Cited

U.S. PATENT DOCUMENTS 5,557,117 A 9/1996 Matsuoka et al. .......... 257/184

FOREIGN PATENT DOCUMENTS

| JP | 04221834 | 8/1992 | ......... H01L/21/331 |
| JP | 06-326120 | 11/1994 | ......... H01L/21/331 |
| JP | 07-161727 | 6/1995 | ......... H01L/21/331 |
| JP | 07-193084 | 7/1995 | ......... H01L/21/331 |
| JP | 09-246281 | 9/1997 | ......... H01L/21/331 |
| JP | 10-050720 | 2/1998 | ......... H01L/21/331 |

OTHER PUBLICATIONS

"Effect of Collector Design on the d.c. Characteristics of In0.49Ga0.51P/GaAs Heterojuncion Bipolar Transistors" Hartman et al. Solid–State Electronics vol. 38, No. 12, pp. 2017–2012, 1995.

"Characterisation of GaInP/GaAs Double Heterojunction Bipolar Transistors with Different Collector Designs" Song et al. *Electronics Letters Online* vol. 29, No. 21, pp. 1881–1883, 1993.

"A 28 GHz Transimpedance Preamplifier with Inductive Bandwidth Enhancement" Montgomery et al. Electo Devices Meeting, 1992 pp. 423–426.

"A New InGaP/GaAs Double Delta–Doped Heterojunction Bipolar Transistor (D3HBT)" Cheng et al. *Thin Solid Films* 345, pp. 270–272, 1999.

"A Novel HBT with Composite Collector for Power Amplifier Application" Su et al. Extended Abstracts of the 2001 International Conference on Solid State Devices and Materials, Toyko, 2001, pp. 338–339.

"Investigation of InGaP/GaAs Double–Delta–Doped Heterojunction Bipolar Transistor" Wang et al. *Semicond. Sci. Technol.* 13, pp. 630–633, 1998.

"AlInAs/GaInAs/InP Double Heterojunction Bipolar Transistor with a Novel Base–Collector Design for Power Applications" Nguyen et al. Electron Devices Meeting, 1999, pp. 799–802.

*Primary Examiner*—Shouxiang Hu
(74) *Attorney, Agent, or Firm*—Hayes Soloway P.C.

(57) ABSTRACT

A heterojunction bipolar transistor has a raised breakdown voltage and restrains the rising characteristic of $I_C$-$V_{CE}$ characteristic from degrading. The collector region includes first, second, and third collector layers of semiconductor. The first collector layer is made of a doped or undoped semiconductor in such a way as to contact the sub-collector region. The second collector layer is made of a doped or undoped semiconductor having a narrower band gap than the first collector layer in such a way as to contact the base region. The third collector layer has a higher doping concentration than the second collector layer in such a way as to be located between or sandwiched by the first collector layer and the second collector layer.

12 Claims, 12 Drawing Sheets

US 6,881,988 B2

HETEROJUNCTION BIPOLAR TRANSISTOR AND SEMICONDUCTOR INTEGRATED CIRCUIT DEVICE USING THE SAME

BACKGROUND OF THE INVENTION

1. Field of the Invention

The present invention relates generally to heterojunction semiconductor devices. More particularly, the invention relates to a heterojunction bipolar transistor having a raised or improved breakdown (withstand) voltage, and a semiconductor integrated circuit device using the same.

2. Description of the Related Art

To improve the collector-to-emitter breakdown voltage of heterojunction bipolar transistors during operation, it is important to suppress or prevent avalanche breakdown in the collector region. To realize this, an improved structure has been developed and disclosed, where a semiconductor layer having a low or small impact ionization coefficient is inserted into a high electric-field part of the collector region. This structure is disclosed in, for example, the Japanese Non-Examined Patent Publication No. 7-16172 published in 1995.

FIG. 1 shows schematically the energy band diagram of a prior-art heterojunction bipolar transistor where a semiconductor layer having a low or small impact ionization coefficient is not inserted into the collector layer region. This transistor comprises an emitter layer 105, a base layer 106, a collector layer 113, and a sub-collector layer 104.

When no or a low collector current flows, the bottom $E_C$ of the conduction band and the top $E_V$ of the valence band in the collector layer 113 are given by the chain lines B1 and B2 in FIG. 1, respectively. When a high collector current flows, the space charge increases and therefore, the bottom $E_C$ of the conduction band and the top $E_V$ of the valence band in the collector layer 113 are respectively raised, as shown by the solid lines A1 and A2 in FIG. 1. As a result, as the collector current increases, the electric-field strength on the base side of the collector layer 113 tends to decrease and at the same time, the electric-field strength on the sub-collector side of the collector layer 113 tends to increase.

FIG. 2 shows schematically the energy band diagram of an improved prior-art heterojunction bipolar transistor to improve the breakdown voltage. This transistor has the same structure as shown in FIG. 1 except that a semiconductor layer 114 is inserted into the collector layer 113. The layer 114 has a wider energy band gap than the layer 113. This structure is disclosed in, for example, the above-identified Publication No. 7-16172.

As seen from the energy band structure of FIG. 2, the semiconductor layer 114 is additionally provided on the sub-collector side of the collector layer 113, which is a high electric-field part. The wider the band gap, the lower the impact ionization coefficient and the higher the breakdown voltage. Therefore, avalanche breakdown is more difficult to occur in the semiconductor layer 114 than in the collector layer 113. This means that the breakdown voltage during operation is raised or improved.

With the energy band structure of FIG. 2, dependent on the type or sort of semiconductor materials used, there arises a possibility that "conduction band discontinuity" occurs between the collector layer 113 and the semiconductor layer 114 which are different in band gap from each other. If so, the high-frequency characteristics of the transistor will deteriorate because of the accumulation and retention effect of carriers caused by the conduction band discontinuity. To suppress the deterioration of the high-frequency characteristics, it is effective to introduce a p-n junction with high doping concentrations between the layers 113 and 114. This is disclosed in the Japanese Non-Examined Patent Publication No. 7-193084 published in 1995. The energy band structure disclosed in this Publication is shown in FIG. 3.

As shown in FIG. 3, a $p^+$-type $In_{0.53}Ga_{0.47}As$ layer 116a doped heavily with a p-type dopant and a $n^+$-type InP layer 116b doped heavily with a n-type dopant are introduced to form a p-n junction between an i-type $In_{0.53}Ga_{0.47}As$ collector layer 113a and a n-type InP collector layer 115. The reference numerals 105a, 106a, and 104a are an emitter layer, a base layer, and a sub-collector layer, respectively.

FIG. 4 shows the energy band structure of a prior-art heterojunction bipolar transistor, which improves both the breakdown voltage and the high-frequency characteristics. This is disclosed in the Japanese Non-Examined Patent Publication No. 6-326120 published in 1996. This structure is obtained by inserting a heavily doped p-type GaAs layer 116 between the i-type GaAs collector layer 113 and the n-type AlGaAs layer 114 having the wider band gap than the layer 113 in the structure of FIG. 2. Due to the insertion of the GaAs layer 116, the electric-field in the collector layer 113 is relaxed and therefore, the electrons are restrained from entering their high-energy states to thereby suppress the reduction of their velocity. Thus, not only the breakdown voltage is raised but also the high-frequency characteristics are improved.

However, the above-described prior-art energy band structures shown in FIGS. 2 to 4 have the following problems.

Specifically, with the prior-art structure of FIG. 2, no measure is taken to restrain the high electric-field part in the collector layer 113 from expanding toward the base layer 106 with the increasing collector current. Therefore, as the collector current increases, the high electric-field part will expand toward not only the semiconductor layer 114 but also the collector layer 113. As a result, a problem that the breakdown voltage decreases arises.

With the prior-art structure of FIG. 3, the $p^+$-type $In_{0.53}Ga_{0.47}As$ layer 116a and the $n^+$-type InP layer 116b relax the band gap discontinuity apparently. However, these layers 116a and 116b form a high doping-concentration p-n junction and thus, very high electric field is generated in the layer 116a. As a result, there arises a problem that avalanche breakdown is likely to occur in the layer 116a. This means that the breakdown voltage is likely to lower. Moreover, even if the band gap discontinuity is apparently relaxed, this is unable to be really eliminated.

In addition, if the collector layer 113 and the semiconductor layer 114 in FIG. 2 are respectively made of GaAs and InGaP, the following problem will occur.

If the InGaP layer 114 is grown to form its natural superlattice, almost all the band gap discontinuity at the interface of the GaAs layer 113 and the InGaP layer 114 can be eliminated. Thus, the energy band structure of FIG. 3 is unnecessary. This means that the energy band structure of FIG. 2 simpler than that of FIG. 3 can be used. However, if so, there arises a problem of degradation of the rising characteristic of the collector current-collector voltage characteristic.

With the prior-art structure of FIG. 4, the $p^+$-type GaAs layer 116 is a heavily doped p-type semiconductor and thus, the potential in the layer 116 is raised. If the n-type AlGaAs layer 115b is replaced with a n-type InGaP layer, the potential of the layer 116 is raised furthermore. As a result, there arises a problem of degradation of the rising characteristic of the collector current-collector voltage characteristic, as well.

SUMMARY OF THE INVENTION

Accordingly, an object of the present invention is to provide a heterojunction bipolar transistor having a raised breakdown voltage, and a semiconductor integrated circuit device using the transistor.

Another object of the present invention is to provide a heterojunction bipolar transistor that restrains the rising characteristic of the collector current-collector voltage characteristic from degrading, and a semiconductor integrated circuit device using the transistor.

The above objects together with others not specifically mentioned will become clear to those skilled in the art from the following description.

According to a first aspect of the invention, a heterojunction bipolar transistor is provided, which comprises:

a sub-collector region made of semiconductor of a first conductivity type;

a collector region made of semiconductor of the first conductivity type in such a way as to contact the sub-collector region;

a base region made of semiconductor of a second conductivity type in such a way as to contact the collector region;

an emitter region made of semiconductor of the first conductivity type in such a way as to contact the base region;

the collector region including:

a first collector layer made of semiconductor of the first conductivity type or undoped semiconductor in such a way as to contact the sub-collector region;

a second collector layer made of semiconductor of the first conductivity type or undoped semiconductor having a narrower band gap than the first collector layer in such a way as to contact the base region; and a third collector layer made of semiconductor of the first conductivity type having a higher doping concentration than the second collector layer in such a way as to be located between the first collector layer and the second collector layer.

With the heterojunction bipolar transistor according to the first aspect of the invention, in the collector region, the third collector layer made of semiconductor of the first conductivity type is provided between the first collector layer (which is made of semiconductor of the first conductivity type or undoped semiconductor) and the second collector layer (which is made of semiconductor of the first conductivity type or undoped semiconductor, also). Thus, the potential at the interface between the first collector layer and the third collector layer is lowered or reduced compared with the case where the third collector layer is not provided. This means that no potential barrier is formed at the interface in question. As a result, the rising characteristic of the collector current-collector voltage characteristic is restrained from degrading.

The potential value or level of the third collector layer, which is located between the first and second collector layers, is changed by changing its doping concentration. This means that the ratio of the electrical potentials (or voltages) applied to the first and second collector layers can be adjusted, in other words, the ratio of the electric fields in the first and second collector layers can be adjusted. Thus, the electric fields in the first and second collector layers can be well assigned in such a way as to accord with the ratio of the impact ionization coefficients of the first and second collector layers. As a result, avalanche breakdown is effectively restrained from occurring in the first and second collector layers, thereby raising or improving the breakdown voltage.

In a preferred embodiment of the transistor according to the first aspect of the invention, the first collector layer is made of InGaP, which contains a natural superlattice having regularly arranged In atoms and Ga atoms in a group-III atomic layer.

In another preferred embodiment of the transistor according to the first aspect of the invention, the third collector layer includes a same semiconductor as the first collector layer or the second collector layer. If the second collector layer is made of GaAs, the third collector layer is made of GaAs or any other semiconductor including GaAs.

In still another preferred embodiment of the transistor according to the first aspect of the invention, the third collector layer is made of semiconductor including GaAs. Preferably, the third collector layer is made of a mixed semiconductor crystal selected from the group consisting of InGaAs, AlGaAs, InAlAs, and InAlGaAs.

In a further preferred embodiment of the transistor according to the first aspect of the invention, the second collector layer is made of semiconductor including GaAs. Preferably, the second collector layer is made of a mixed semiconductor crystal selected from the group consisting of InGaAs, AlGaAs, InAlAs, and InAlGaAs.

It is preferred that the third collector layer has a thickness of 10 nm or less and that the third collector layer is made of at least one of InGaP and GaAs.

It is preferred that the first collector layer has a thickness of ($1/10$) (one-tenth) of a total thickness of the collector region or greater.

It is preferred that the third collector layer has a doping concentration of $5 \times 10^{17}$ cm$^{-3}$ or greater.

In a still further preferred embodiment of the transistor according to the first aspect of the invention, an additional sub-collector layer having a wider band gap than the second collector layer is provided in the sub-collector region in such a way as to be adjacent to the first collector layer.

According to a second aspect of the invention, a semiconductor integrated circuit device is provided. This device comprises a plurality of the heterojunction bipolar transistors according to the first aspect.

It is obvious that the same advantages as those in the transistor according to the first aspect of the invention are obtainable in the semiconductor integrated circuit device according to the second aspect of the invention.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
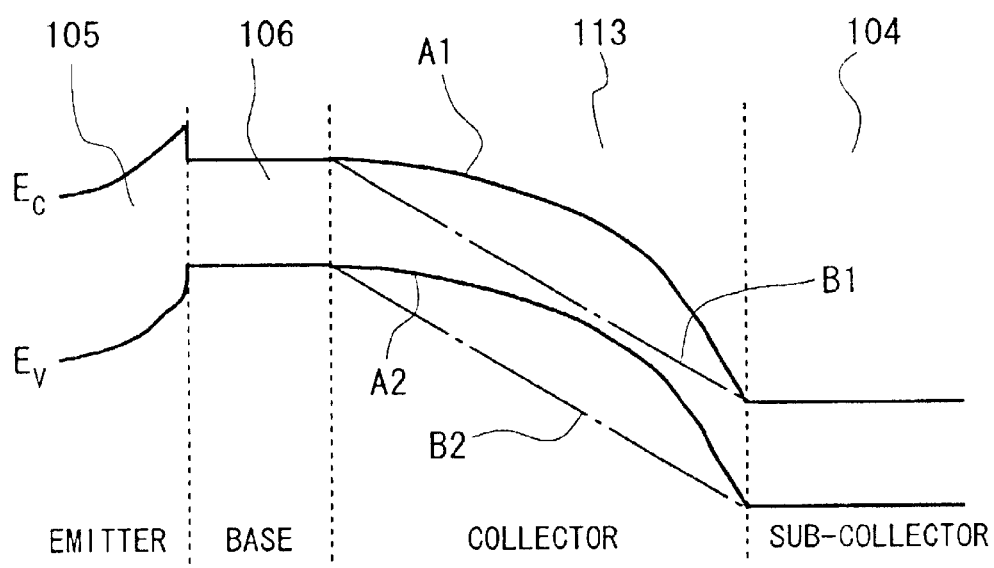
FIG. 1 is a schematic energy band diagram of a first prior-art heterojunction bipolar transistor.

Preferred embodiments of the present invention will be described in detail below while referring to the drawings attached.

First Embodiment

Figure 5:
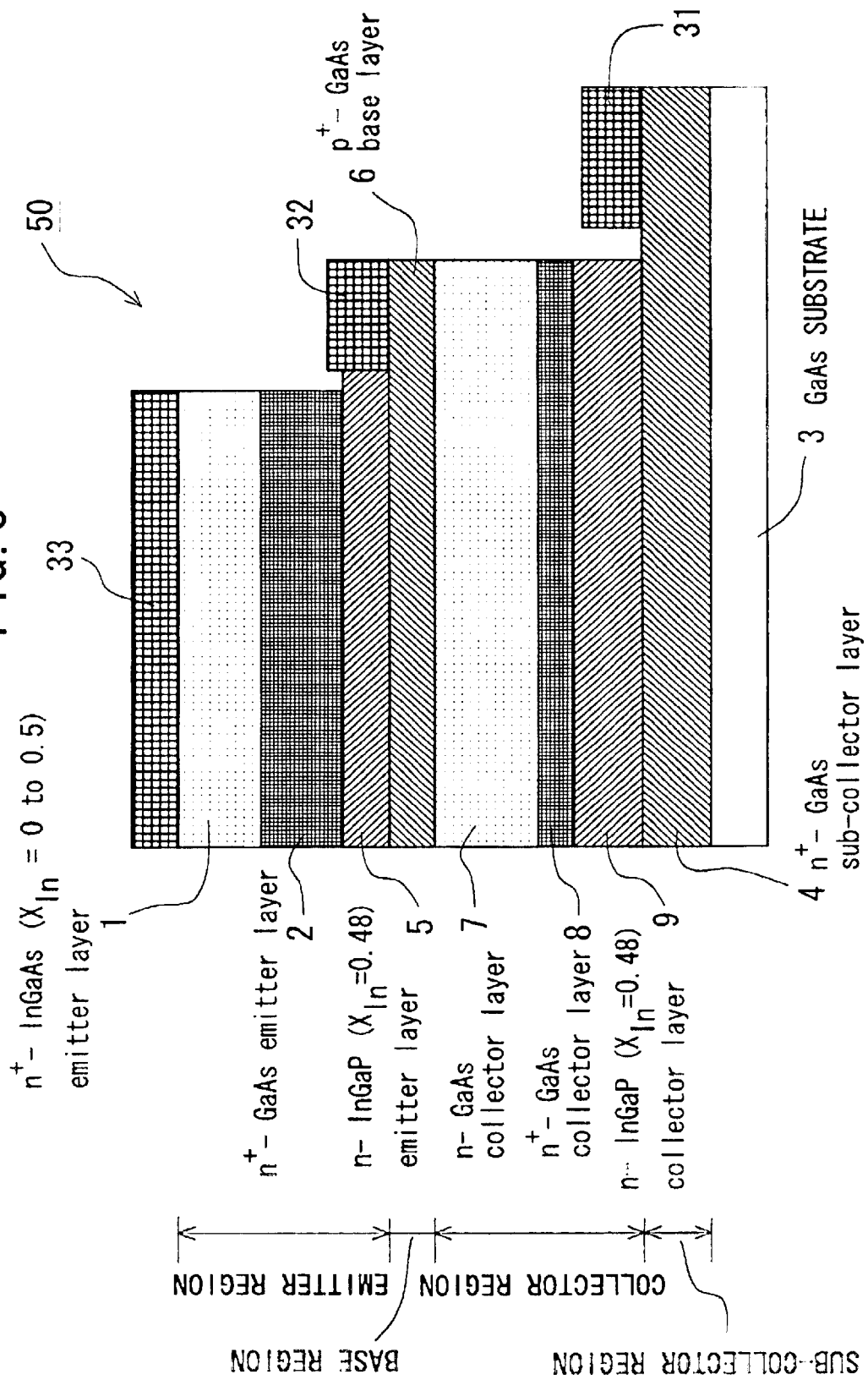
FIG. 5 is a schematic cross-sectional view of a heterojunction bipolar transistor according to a first embodiment of the invention, which shows the layered structure thereof.

FIG. 5 shows the layered structure of a npn-type heterojunction bipolar transistor 50 according to a first embodiment of the invention.

As shown in FIG. 5, the transistor 50 comprises a semi-insulating GaAs substrate 3, a $n^+$-type GaAs sub-collector layer 4 (thickness: 500 nm) formed on the substrate 3, and a n-type InGaP collector layer 9 (thickness: 100 nm) formed on the layer 4. The surface of the sub-collector layer 4 is partially exposed from the overlying collector layer 9. A collector electrode 31 is formed on the exposed part of the layer 4.

The $n^+$-type GaAs sub-collector layer 4 is doped with silicon (Si) as a n-type dopant at a doping concentration of $4.0 \times 10^{18}$ cm$^{-3}$. The n-type InGaP collector layer 9 has a composition ratio of In (i.e., $X_{In}$) of 0.48 and thus, it is expressed as $In_{0.48}Ga_{0.52}P$. However, the In composition ratio $X_{In}$ may be set at a value in the range from 0.48 to 0.5. The $n^+$-type InGaP collector layer 9 is doped with Si as a n-type dopant at a doping concentration of $1.0 \times 10^{16}$ cm$^{-3}$. The collector layer 9 contains natural superlattices of InGaP having regularly arranged In atoms and Ga atoms in its group-III atomic layer.

On the n-type InGaP collector layer 9, an extremely thin $n^+$-type GaAs collector layer 8 (thickness: 5 nm) is formed. The layer 8 is doped with Si as a n-type dopant at a doping concentration of $3.0 \times 10^{18}$ cm$^{-3}$.

On the $n^+$-type GaAs collector layer 8, a n-type GaAs collector layer 7 (thickness: 720 nm) is formed. The layer 7 is doped with Si as a n-type dopant at a doping concentration of $5.0 \times 10^{15}$ cm$^{-3}$. Therefore, the doping concentration of the layer 8 is higher than that of the overlying layer 7.

On the n-type GaAs collector layer 7, a $p^+$-type GaAs base layer 6 (thickness: 80 nm) is formed. The layer 6 is doped with carbon (C) as a p-type dopant at a doping concentration of $4.0 \times 10^{19}$ cm$^{-3}$. The surface of the base layer 6 is partially exposed from an overlying n-type InGaP emitter layer 5. A base electrode 32 is formed on the exposed part of the layer 6.

On the $p^+$-type GaAs base layer 6, the n-type InGaP emitter layer 5 (thickness: 30 nm) is formed. The emitter layer 5 is doped with Si as a n-type dopant at a doping concentration of $3.0 \times 10^{17}$ cm$^{-3}$. The layer 5 has an In composition ratio $X_{In}$ of 0.48 and thus, it is expressed as $In_{0.48}Ga_{0.52}P$. However, the In composition ratio $X_{In}$ may be set at a value in the range from 0.48 to 0.5. The end of the emitter layer 5 contacts the base electrode 32.

On the n-type InGaP emitter layer 5, a $n^+$-type GaAs emitter layer 2 (thickness: 200 nm) is formed. The emitter layer 2 is doped with Si as a n-type dopant at a doping concentration of $3.0 \times 10^{18}$ cm$^{-3}$.

On the $n^+$-type GaAs emitter layer 2, a $n^+$-type InGaAs emitter layer 1 (thickness: 100 nm) is formed. The emitter layer 1 is doped with Si as a n-type dopant at a doping concentration of $2.0 \times 10^{19}$ cm$^{-3}$. The layer 1 has a varying In composition ratio $X_{In}$ from 0 to 0.5. The ratio $X_{In}$ of the layer 1 is set at 0 at the contacting plane with the $n^+$-type InGaAs emitter layer 2, is gradually increased upward toward an overlying emitter electrode 33, and is set at 0.5 at the contacting plane with the electrode 33.

The emitter electrode 33 is located on the $n^+$-type InGaAs emitter layer 1 to cover the whole surface of the layer 1.

The sub-collector layer 4 constitutes the sub-collector region of the transistor 50, the collector layers 9, 8, and 7 constitute the collector region thereof, the base layer 6 constitutes the base region thereof, and the emitter layers 5, 2, and 1 constitute the emitter region thereof.

Figure 6:
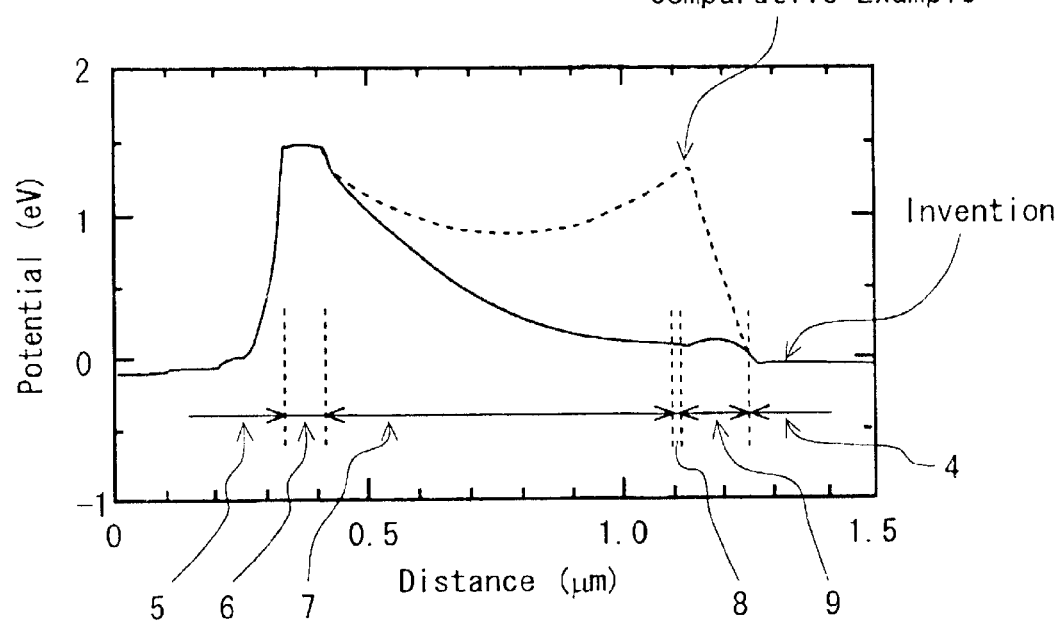
FIG. 6 is an energy band diagram of the transistor according to the first embodiment of FIG. 5, in which the relationship between the potential and the distance is shown along with that of the transistor of comparative example.

As explained above, the heterojunction bipolar transistor 50 according to the first embodiment has the layered structure shown in FIG. 5. The energy band diagram of the conduction band of the transistor is given by the solid line in FIG. 6. The broken line in FIG. 6 shows the energy band diagram of the conduction band of a prior-art heterojunction bipolar transistor having a layered structure obtained by removing the $n^+$-type GaAs collector layer 8 from the structure of FIG. 5. These diagrams were obtained by setting the biasing point at a point where the collector voltage (i.e., the collector-to-emitter voltage) $V_{CE}=0$ V and the base voltage (i.e., the base-to-emitter voltage) $V_{BE}=0$ V.

With the transistor 50 according to the first embodiment of FIG. 5, a $n^+$-type GaAs collector layer 8 and an n-type GaAs collector layer 7 are provided between the n-type InGaP collector layer 9 and the $p^+$-type GaAs base layer 6. At the same time as this, the In composition ratio $X_{In}$ of the collector layer 9 is set at a value (i.e., approximately 0.48) lattice-matched with GaAs of the collector layers 8 and 7. Moreover, the n-type InGaP collector layer 9 is formed by epitaxial growth under the condition that a natural superlattice of InGaP is generated (i.e., the band gap $E_g$ is set at 1.86 eV). Accordingly, an interface level of approximately $2 \times 10^{12}$ cm$^{-3}$ is generated at the interface of the collector layers 9 and 8, which causes exhaustion of carriers at the same interface.

On the other hand, with the transistor of comparative example where the n$^+$-type GaAs collector layer 8 is removed, the potential has a peak at the interface of the collector layers 9 and 7, as shown by the broken line in FIG. 6. This potential peak functions as a "potential barrier" when electrons are moved from the p$^+$-type GaAs base layer 6 to the n$^+$-type GaAs sub-collector layer 4. As a result, the electrical current flowing from the sub-collector layer 4 to the base layer 6 is restrained or limited.

Unlike this, with the transistor 50 according to the first embodiment of FIG. 5, the n$^+$-type GaAs collector layer 8 is inserted between the n-type InGaP collector layer 9 and the n-type GaAs collector layer 7. Therefore, the exhaustion of carriers at the interface of the collector layers 9 and 8 can be compensated by changing the value or level of the potential in the collector layer 8. As a result, as shown by the solid line in FIG. 6, no potential peak is generated between the collector layers 9 and 7. This means that the electrical current flowing from the sub-collector layer 4 to the base layer 6 is not restrained or limited.

Figure 7:
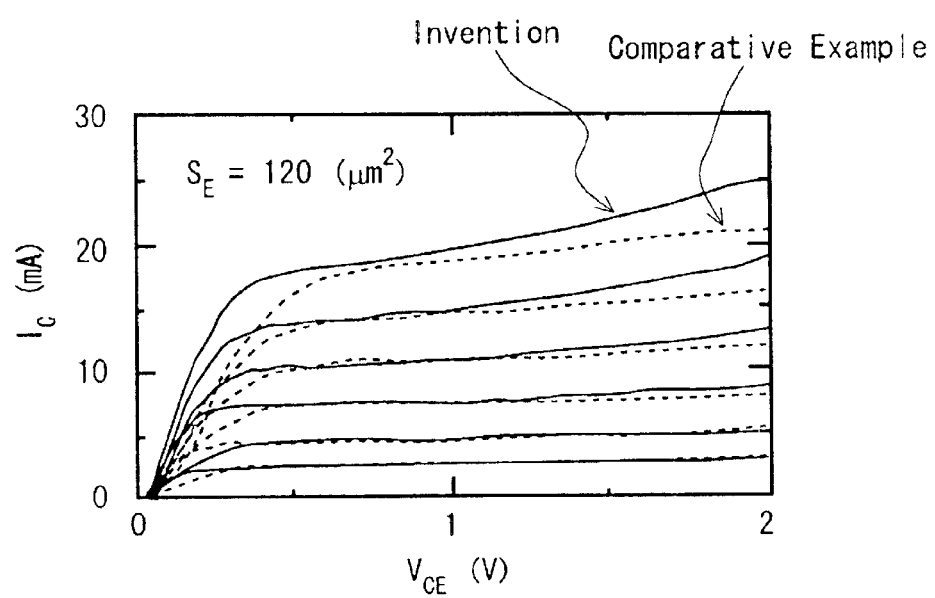
FIG. 7 is a graph showing the collector current-collector voltage ($I_C$-$V_{CE}$) characteristic of the transistor according to the first embodiment of FIG. 5, along with that of the transistor of comparative example.

FIG. 7 is a graph showing the relationship between the collector current I$_C$ and the collector voltage V$_{CE}$ in the g$_m$ mode, where the emitter area S$_E$ is set at 120 $\mu$m$^2$.

With the transistor of comparative example where the n$^+$-type GaAs collector layer 8 is removed, as shown by the broken lines in FIG. 7, when the collector voltage VCE is low, the collector current I$_C$ does not increase so much. This is because the electrons are restrained from moving due to the potential barrier generated at the interface of the collector layers 9 and 7. When the collector voltage V$_{CE}$ is considerably high, a high electric-field part is formed at the side of the GaAs sub-collector layer 4 and thus, the potential value or level at the interface of the collector layers 9 and 7 is lowered. In this way, the potential barrier is eliminated and the collector current I$_C$ increases. This means that the rising characteristic of the collector current I$_C$ degrades, in other words, the rising of the current I$_C$ becomes dull or slow.

However, with the transistor 50 according to the first embodiment, due to addition of the n$^+$-type GaAs collector layer 8, no potential barrier is generated between the collector layers 9 and 7 even when the collector voltage V$_{CE}$ is low. Therefore, the rising characteristic of the collector current I$_C$ is improved, in other words, the rising of the current I$_C$ is sharp.

Figure 8:
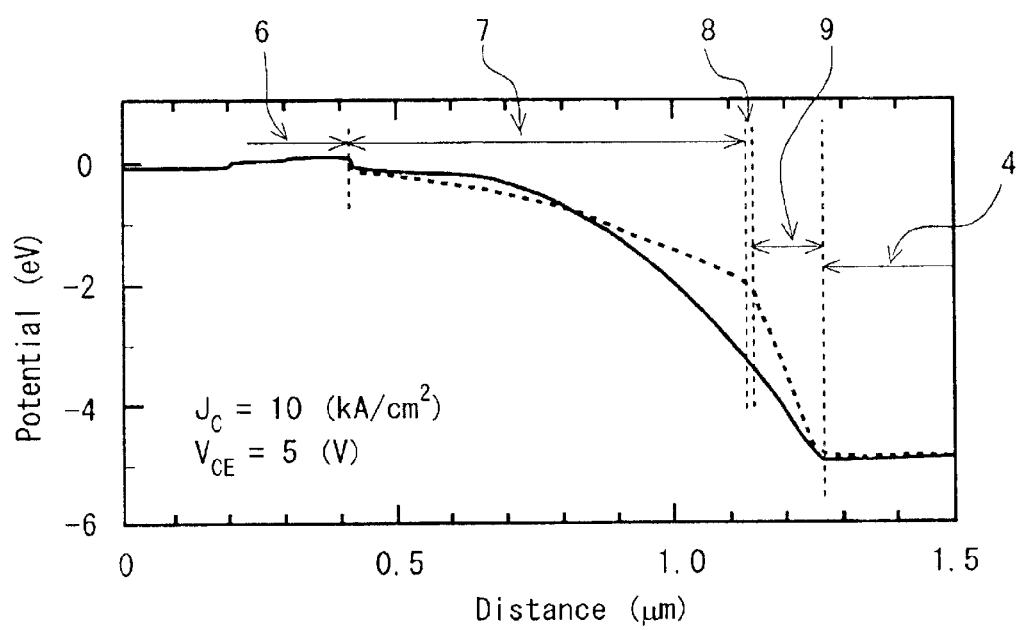
FIG. 8 is an energy band diagram of the transistor according to the first embodiment of FIG. 5, in which the relationship between the potential and the distance is shown.
Figure 9:
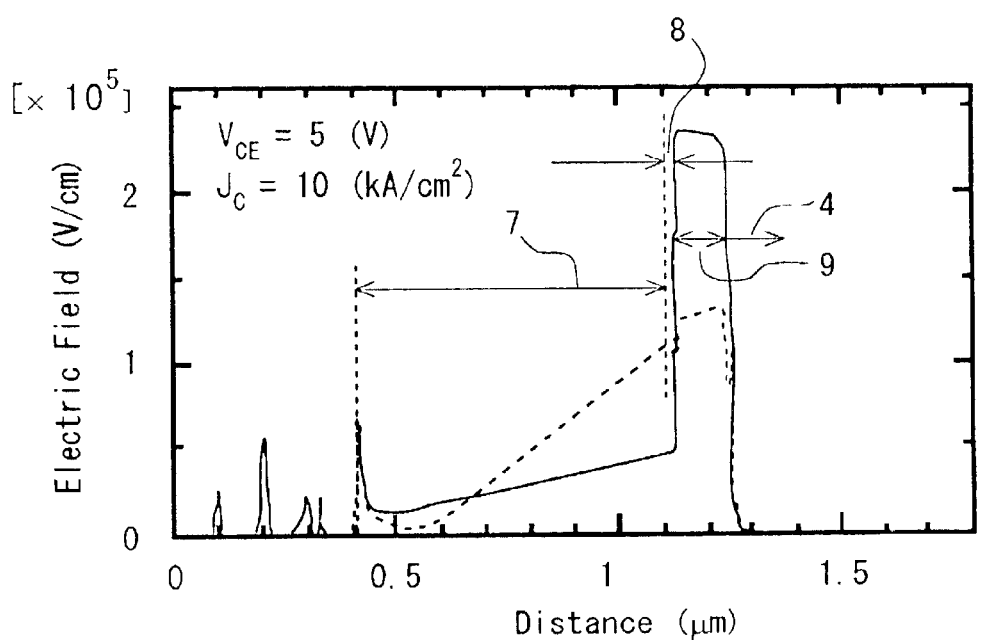
FIG. 9 is a graph showing the electric-field distribution of the transistor according to the first embodiment of FIG. 5 in which the relationship between the electric field and the distance is shown.

FIGS. 8 and 9 show the energy band diagram and the electric-field distribution diagram of the transistor 50 according to the first embodiment, respectively, where the collector current density J$_C$ is set at 10 kA/cm$^2$ and the collector voltage V$_{CE}$ is set at 5 V.

Since the potential in the n$^+$-type GaAs collector layer 8 can be changed by changing the doping concentration thereof, the electric field applied to the n-type InGaP collector layer 9 can be changed from the values shown by the broken line to the values shown by the solid line, as shown in FIG. 9. Therefore, the ratio of the electric fields applied to the collector layers 9 and 7 can be determined while taking the impact ionization coefficients of the layers 9 and 7 into consideration.

Figure 10:
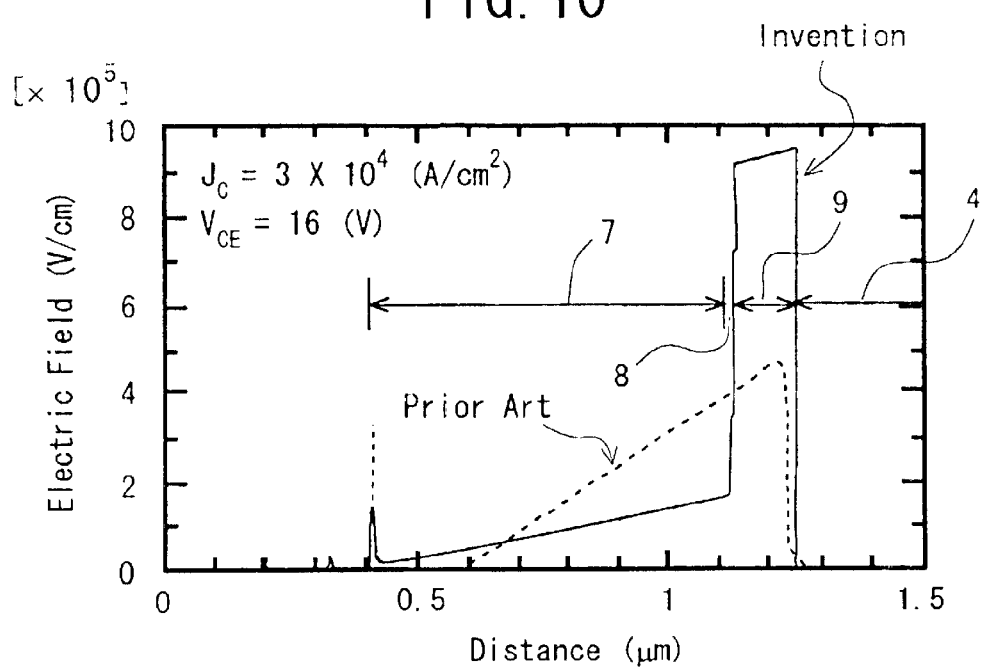
FIG. 10 is a graph showing the electric-field distribution of the transistor according to the first embodiment of FIG. 5 and the second prior-art transistor of FIG. 2, in which the relationship between the electric field and the distance is shown.

FIG. 10 shows the electric-field distribution of the transistor 50 of the first embodiment, where the collector current density J$_C$ is set at 3×10$^4$ A/cm$^2$ and the collector voltage V$_{CE}$ is set at 16 V.

Figure 2:
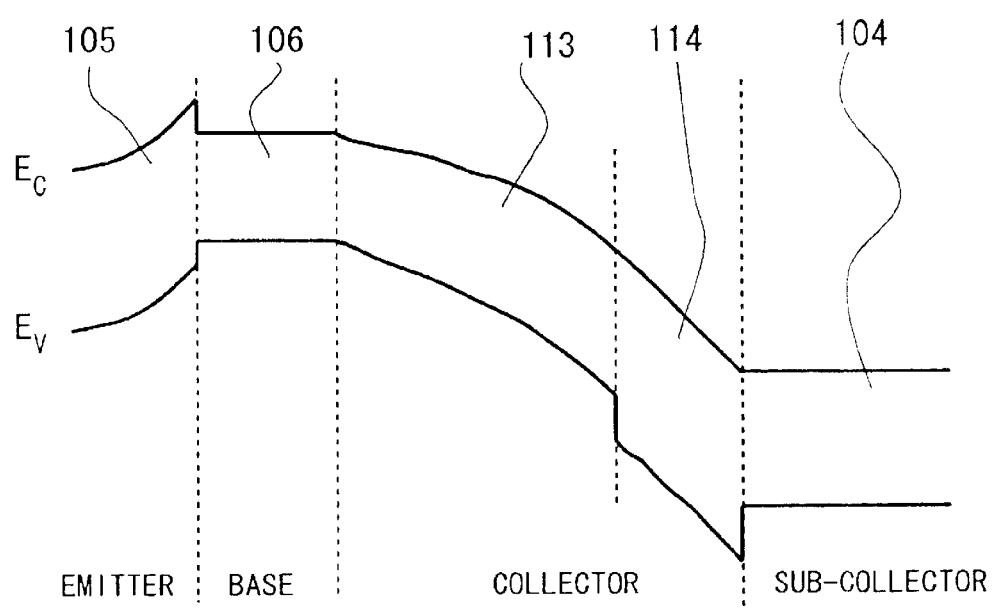
FIG. 2 is a schematic energy band diagram of a second prior-art heterojunction bipolar transistor.
Figure 3:
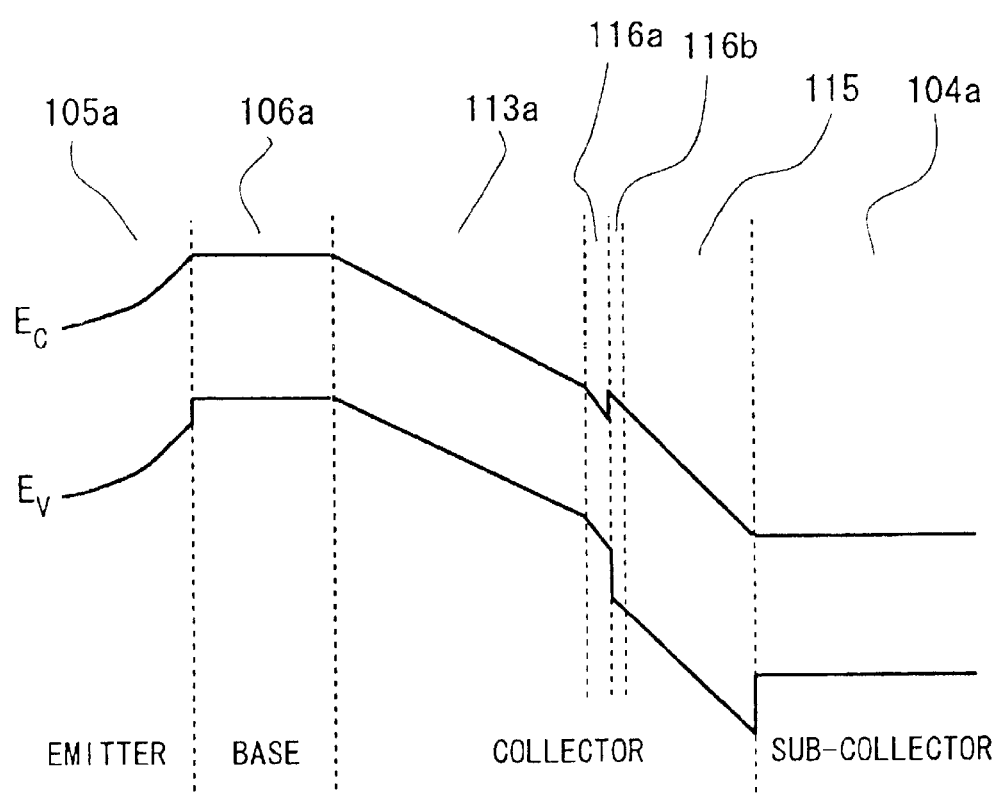
FIG. 3 is a schematic energy band diagram of a third prior-art heterojunction bipolar transistor.
Figure 4:
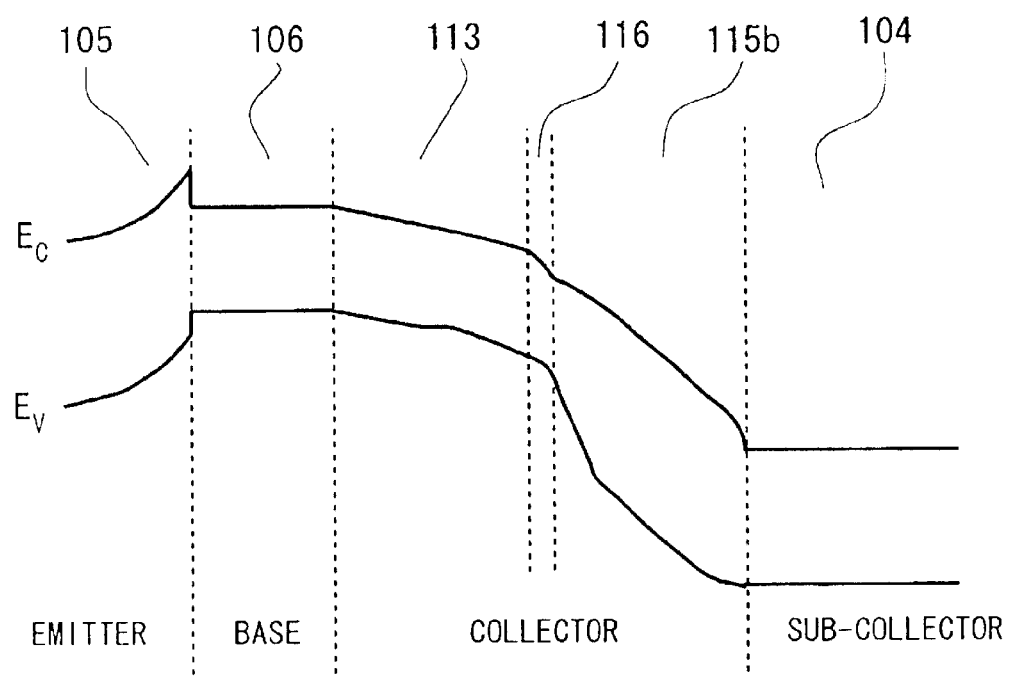
FIG. 4 is a schematic energy band diagram of a fourth prior-art heterojunction bipolar transistor.

In FIG. 10, the electric-field distribution of the prior-art transistor of FIG. 2 is also shown. With this prior-art transistor, the collector layer 113 is formed by a n-type GaAs layer (thickness: 725 nm, doping concentration: 5×10$^{15}$ cm$^{-3}$), and the semiconductor layer 114 is formed by a n-type InGaP layer (thickness: 100 nm, doping concentration: 5×10$^{15}$ cm$^{-3}$). Since the rising characteristic of the collector current I$_C$ degrades due to exhaustion of carriers in the layers 113 and 114, as shown in FIG. 7, calculation was carried out under the supposition that no exhaustion of carriers occurs.

With the prior-art transistor of FIG. 2, as seen from the electric-field distribution shown by the broken line in FIG. 9, the high electric-field part, which is formed on the side of the sub-collector layer 4 in the n-type InGaP collector layer 9, extends to the inside of the n-type GaAs collector layer 7. Unlike this, with the transistor 50 of the first embodiment, as seen from the electric-field distribution shown by the broken line in FIG. 9, the high electric-field part, in which the value of the electric-field is 2×10$^{15}$ V/cm or greater, is entirely located in the n-type InGaP collector layer 9 where avalanche breakdown is unlikely to occur. Thus, avalanche breakdown is effectively restrained from occurring in the collector layer 7.

The breakdown voltage at the collector current density J$_C$ of 25 kA/cm$^2$ was 6.2 V for the prior-art transistor of FIG. 2. On the other hand, it was 7.4 V for the transistor 50 of the first embodiment when this transistor had the potential curve (i.e., the energy band) given by the solid line in FIG. 8. It was raised to 11.0 V if the transistor 50 of the first embodiment had the potential curve (i.e., the energy band) given by the broken line in FIG. 8. These results were given by the inventors' test.

As explained above, with the transistor 50 of the first embodiment, the high electric-field part is focused on or confined in the n-type InGaP collector layer 9 in the "collector region" (i.e., in the region sandwiched by the sub-collector layer 4 and the base layer 6) Therefore, if the collector layer 9 is too thin, the electric field in the layer 9 will be too strong. Thus, it is preferred that the thickness of the layer 9 is equal to one-tenth (¹⁄₁₀) of the total or overall thickness of the collector region or greater. In the transistor 50 of the first embodiment, the overall thickness t of the collector region is given as $$t=100 \text{ nm}+5 \text{ nm}+720 \text{ nm}=825 \text{ nm}$$

Therefore, it is preferred that the thickness of the layer 9 is 83 nm or greater.

Next, the preferred doping concentration and thickness of the n$^+$-type GaAs collector layer 8 in the transistor 50 will be explained below.

Typically, a heterojunction bipolar transistor is operated in such a way that the collector current density is 1×10$^5$ A/cm$^2$ or less. Thus, if the electron velocity in the collector region is supposed at 1×10$^7$ cm/s, the space charge is given as approximately 5×10$^{16}$ cm$^{-3}$. Accordingly, to suppress the potential change of the conduction band in the n$^+$-type GaAs collector layer B due to the change of the collector current density, it is preferred that the doping concentration of the layer 8 is set to be greater than the space charge value of approximately 5×10$^{16}$ cm$^{-3}$ by one level of magnitude (i.e., the doping concentration of the layer 8 is approximately 5×10$^{17}$ cm$^{-3}$) or greater.

The value of carrier exhaustion at the interface of the GaAs collector layer 8 and the InGaP collector layer 9, which varies according to the epitaxial growth condition of InGaP, corresponds to the sheet concentration of dopant of 5×10$^{12}$ cm$^{-2}$ at the maximum. Thus, it is sufficient that the sheet concentration of dopant of the collector layer 8 is 5×10$^{12}$ cm$^{-2}$ or less. If the doping concentration of the collector layer 8 is set at $5\times10^{17}$ cm$^{-3}$, the thickness of the layer 8 will be 10 nm at the maximum sheet concentration of $5\times10^{12}$ cm$^{-2}$. As a result, it is preferred that the thickness of the layer 8 is 10 nm or less.

With the heterojunction bipolar transistor 50 according to the first embodiment of FIG. 5, as explained above, in the collector region, the n$^+$-type GaAs collector layer 8 is additionally provided between the n-type InGaP collector layer 9 and the n-type GaAs collector layer 7. Thus, the potential at the interface between the collector layers 9 and 8 is lowered or reduced compared with the case where the collector layer 8 is not provided. This means that no potential barrier is formed at the interface in question. As a result, the rising characteristic of the collector current-collector voltage ($I_C$-$V_{CE}$) characteristic is restrained from degrading.

The potential value or level of the n$^+$-type GaAs collector layer 8 is changed by changing its doping concentration. This means that the ratio of the electrical potentials (or voltages) applied to the collector layers 9 and 7 can be adjusted, in other words, the ratio of the electric fields in the collector layers 9 and 7 can be adjusted. Thus, the electric fields in the collector layers 9 and 7 can be well assigned in such a way as to accord with the ratio of the impact ionization coefficients of these collector layers 9 and 7. As a result, avalanche breakdown is effectively restrained from occurring in these collector layers 9 and 7, thereby raising or improving the breakdown voltage.

In the above-explained transistor 50 of the first embodiment, the collector layer 8 added is made of the same semiconductor (i.e., GaAs) as the GaAs collector layer 7. However, the invention is not limited to this. The collector layer 8 may be made of the same semiconductor (i.e., InGaP) as the InGaP collector layer 9. Moreover, the layer 8 may have a two-layer structure consisting of a GaAs sublayer and a InGaP sublayer. The layer 8 may be made of the other mixed-crystal semiconductor, such as InGaAs, AlGaAs, InAlGaAs, and InAlAs. The layer 8 may have a multiple-layer structure including sublayers made of these semiconductors.

It is sufficient that the n-type GaAs collector layer 7 is made of semiconductor containing GaAs. In other words, the layer 7 may be made of mixed semiconductor crystal containing GaAs, such as AlGaAs, InGaAs, InAlGaAs, and GaAsP.

Each of the n-type GaAs collector layer 7 and the n-type InGaP collector layer 9 may be made of undoped semiconductor (i.e., semiconductor doped with no dopant).

Second Embodiment

Figure 11:
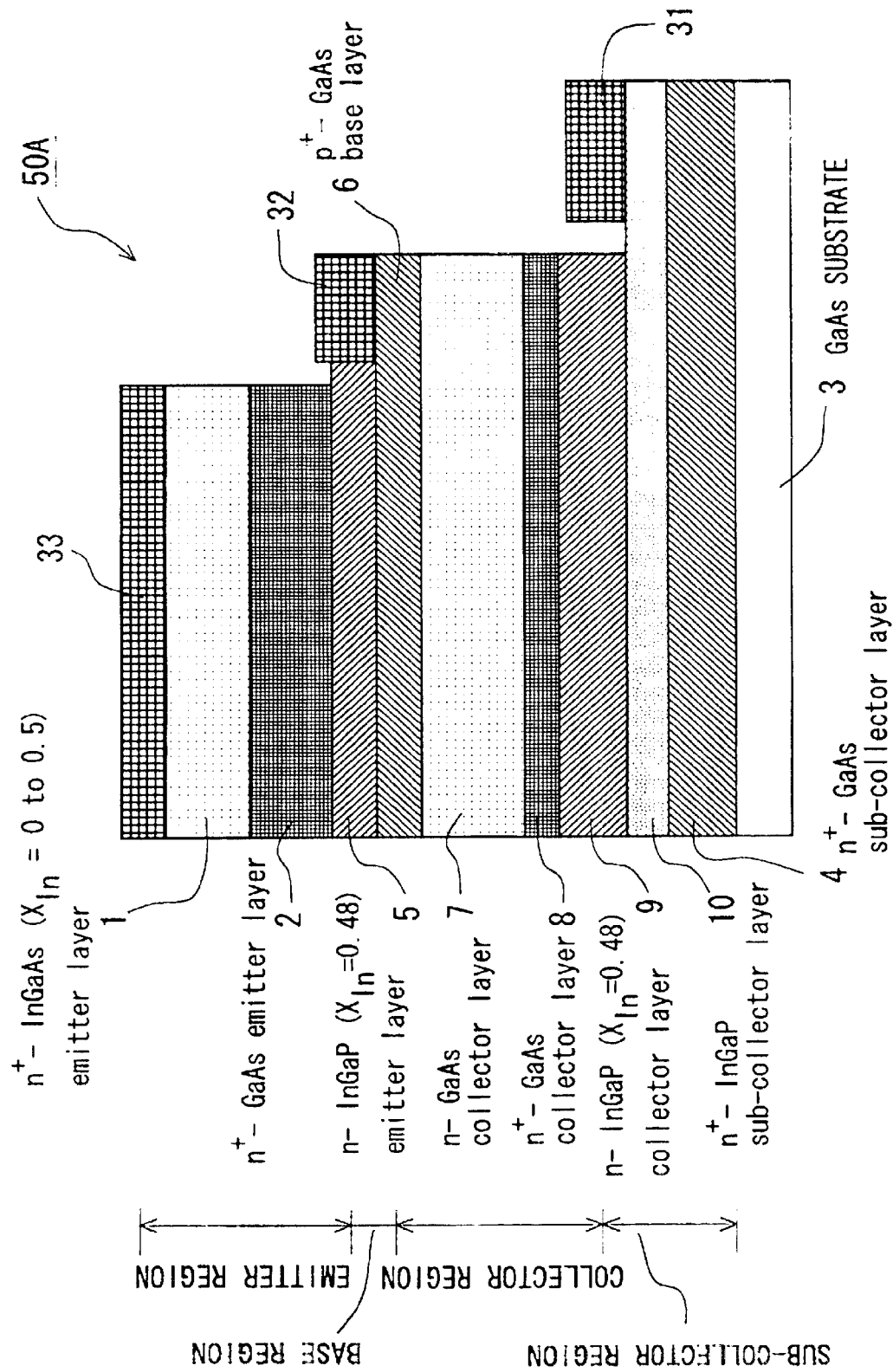
FIG. 11 is a schematic cross-sectional view of a heterojunction bipolar transistor according to a second embodiment of the invention, which shows the layered structure thereof.

FIG. 11 shows the layered structure of a npn-type heterojunction bipolar transistor 50A according to a second embodiment of the invention.

With the above-described heterojunction bipolar transistor 50 according to the first embodiment of FIG. 5, the high-electric field part is generated in the n$^+$-type InGaP collector layer 9. However, if the doping concentration of the n$^+$-type GaAs sub-collector layer 4 is insufficient, the depletion layer formed in the collector region (i.e., in the collector layers 7, 8, and 9) will expand to the inside of the sub-collector layer 4. In this case, high electric field will be generated in the depleted part of the layer 4. Accordingly, to make sure that the advantages of the invention are obtainable, it is preferred that a semiconductor layer having a wider energy band gap than the collector layer 7 is additionally provided on the side of the sub-collector layer 4 to be adjacent to the collector layer 9. The transistor 50A of the second embodiment comprises such a wide band-gap semiconductor layer.

Specifically, as shown in FIG. 11, a n$^+$-type sub-collector layer 10 (thickness: 500 nm) is additionally provided between the n$^{30}$-type GaAs sub-collector layer 4 and the n-type InGaP collector layer 9. The layer 10 is doped with Si as a n-type dopant at a doping concentration of $4.0\times10^{18}$ cm$^{-3}$.

The other structure of the transistor 50A is the same as the transistor 50 of the first embodiment of FIG. 5. Thus, no further explanation on the structure is presented here for the sake of simplification.

Although the n$^+$-type InGaP sub-collector layer 10 is additionally provided in the transistor 50A of the second embodiment, the invention is not limited to this. Any other semiconductor than InGaP may be used for the sub-collector layer 10 if it has an energy band gap wider than the n-type GaAs collector layer 7.

It is preferred that the doping concentration of the sub-collector layer 10 is higher than that of the n-type InGaP collector layer 9. For example, preferably, it is set as $5.0\times10^{17}$ cm$^{-3}$ or greater.

It is preferred that the thickness of the sub-collector layer 10 is sufficiently large in order that the layer 10 may not be partially or entirely depleted when the maximum breakdown voltage is applied across the transistor 50A. For example, the thickness of the layer 10 is preferably 5 nm or greater when the doping concentration of the layer 10 is $4.0\times10^{18}$ cm$^{-3}$.

With the transistor 50A according to the second embodiment of FIG. 11, it is obvious that the same advantages as those of the transistor 50 according to the first embodiment are obtainable. Moreover, it is sure that these advantages are obtainable in the second embodiment compared with the first embodiment.

Third Embodiment

Figure 12:
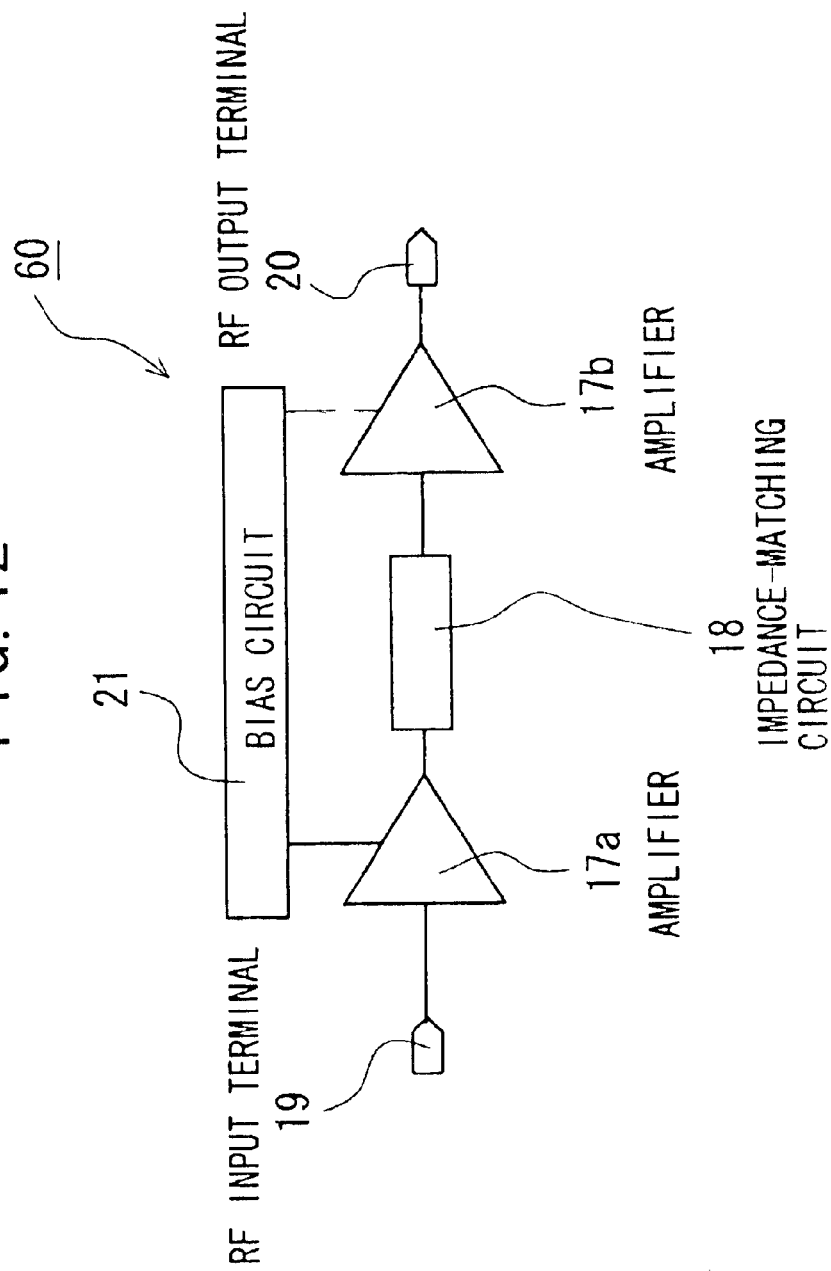
FIG. 12 is a schematic circuit diagram of a semiconductor integrated circuit device according to a third embodiment of the invention, in which the transistors according to the first or second embodiment are used.

FIG. 12 shows the circuit diagram of a semiconductor integrated circuit device (IC) 60 according to a third embodiment of the invention. This IC or device 60 is applicable to high-output amplifier IC for microwaves.

As shown in FIG. 12, the IC 60 comprises an amplifier 17a and an amplifier 17b serially connected to each other by way of an impedance-matching circuit 18 located therebetween. These elements 17a, 17b and 18 are located between a RF (Radio-Frequency) input terminal 19 and a RF output terminal 20. A bias circuit 21 supplies specific bias voltages to the amplifiers 17a and 17b.

The amplifier 17a, which is located on the input terminal side, is in a driver amplifier stage. The amplifier 17a comprises a plurality of the heterojunction bipolar transistors 50 or 50A according to the first or second embodiment, where the total emitter area of the transistors 50 or 50A used is set at 960 $\mu$m$^2$. The amplifier 17b, which is located on the output terminal side, is in a power amplifier stage. Like the amplifier 17a, the amplifier 17b comprises a plurality of the heterojunction bipolar transistors 50 or 50A according to the first or second embodiment, where the total emitter area of the transistors 50 or 50A used is set at 7200 $\mu$m$^2$.

It is obvious that the same advantages as those in the first or second embodiment are obtainable in the IC 60 of the third embodiment.

The circuit shown in FIG. 12 is an example. Therefore, it is needless to say that the IC 60 may have any other circuit configuration as desired.

Variations

Needless to say, the present invention is not limited to the above-described first to third embodiments, because these embodiments are preferred examples of the invention. Any change or modification may be added to them within the spirit of the invention.

The layered structures shown in FIGS. 5 and 11 are only examples. Thus, any other layered structure may be applied to the transistor according to the invention.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A heterojunction bipolar transistor comprising:
   a sub-collector region made of semiconductor of a first conductivity type;
   a collector region made of semiconductor of the first conductivity type in contact with the sub-collector region;
   a collector electrode spaced apart from the collector region and in contact with the sub-collector region;
   a base region made of semiconductor of a second conductivity type in contact with the collector region;
   an emitter region made of semiconductor of the first conductivity type in contact with the base region;
   the collector region including:
      a first collector layer made of InGaP, which contains a natural superlattice having regularly arranged In atoms and Ga atoms in a group-III atomic layer, in contact with the sub-collector region;
      a second collector layer made of semiconductor of the first conductivity type or undoped semiconductor, said second collector layer (a) having a larger thickness than the first collector layer, and (b) having a narrower band gap than the first collector layer, in contact with the base region; and
      a third collector layer made of semiconductor of the first conductivity type having a higher doping concentration than the second collector layer located between the first collector layer and the second collector layer,
   wherein the collector region is sandwiched between the sub-collector region and the base region.

2. The transistor according to claim 1, wherein the third collector layer includes a same semiconductor as the first collector layer or the second collector layer.

3. The transistor according to claim 1, wherein the third collector layer is made of semiconductor including GaAs.

4. The transistor according to claim 1, wherein the third collector layer is made of a mixed semiconductor crystal selected from the group consisting of InGaAs, AlGaAs, InAlAs, and InAlGaAs.

5. The transistor according to claim 1, wherein the second collector layer is made of semiconductor including GaAs.

6. The transistor according to claim 1, wherein the second collector layer is made of a mixed semiconductor crystal selected from the group consisting of InGaAs, AlGaAs, InAlAs, and InAlGaAs.

7. The transistor according to claim 1, wherein the third collector layer has a thickness of 10 nm or less.

8. The transistor according to claim 1, wherein the third collector layer is made of at least one of InGaP and GaAs.

9. The transistor according to claim 1, wherein the first collector layer has a thickness of one-tenth or greater of a total thickness of the collector region.

10. The transistor according to claim 1, wherein the third collector layer has a doping concentration of $5 \times 10^{17}$ cm$^{-3}$ or greater.

11. The transistor according to claim 1, further comprising an additional sub-collector layer having a wider band gap than the second collector layer;
   wherein the additional sub-collector layer has a doping concentration of $5 \times 10^{17}$ cm$^{-3}$ or greater, and is provided in the sub-collector region adjacent to the first collector layer.

12. A semiconductor integrated circuit device comprising a plurality of the heterojunction bipolar transistors according to claim 1.

* * * * *